United States Patent
Lu et al.

(10) Patent No.: US 9,218,999 B2
(45) Date of Patent: Dec. 22, 2015

(54) PACKAGING PROCESS TOOLS AND PACKAGING METHODS FOR SEMICONDUCTOR DEVICES

(71) Applicant: Taiwan Semiconductor Manufacturing Company, Ltd., Hsin-Chu (TW)

(72) Inventors: Wen-Hsiung Lu, Jhonghe (TW); Ming-Da Cheng, Jhubei (TW); Wei-Hung Lin, Xinfeng Township (TW); Kuei-Wei Huang, Hsin-Chu (TW); Chih-Wei Lin, Zhubei (TW); Chun-Cheng Lin, New Taipei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/339,203

(22) Filed: Jul. 23, 2014

(65) Prior Publication Data

US 2014/0331462 A1    Nov. 13, 2014

Related U.S. Application Data

(62) Division of application No. 13/270,890, filed on Oct. 11, 2011, now Pat. No. 8,809,117.

(51) Int. Cl.
| | |
|---|---|
| *B23Q 3/00* | (2006.01) |
| *H01L 21/683* | (2006.01) |
| *H01L 21/56* | (2006.01) |
| *H01L 23/00* | (2006.01) |

(52) U.S. Cl.
CPC .......... *H01L 21/6835* (2013.01); *H01L 23/562* (2013.01); *H01L 24/75* (2013.01); *H01L 24/97* (2013.01); *H01L 21/561* (2013.01); *H01L 24/13* (2013.01); *H01L 24/16* (2013.01); *H01L 2224/0401* (2013.01); *H01L 2224/05027* (2013.01); *H01L 2224/05124* (2013.01); *H01L 2224/05554* (2013.01); *H01L 2224/05572* (2013.01); *H01L 2224/05599* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13169* (2013.01); *H01L 2224/16238* (2013.01); *H01L 2224/2919* (2013.01); *H01L 2224/32225* (2013.01); *H01L 2224/73204* (2013.01); *H01L 2224/75754* (2013.01); *H01L 2224/7698* (2013.01); *H01L 2224/81136* (2013.01); *H01L 2224/81191* (2013.01); *H01L 2224/81815* (2013.01); *H01L 2224/97* (2013.01); *H01L 2924/00014* (2013.01); *H01L 2924/15311* (2013.01); *H01L 2924/351* (2013.01); *Y10T 29/41* (2015.01)

(58) Field of Classification Search
USPC ..................... 269/289 R, 302, 903
See application file for complete search history.

(56) References Cited

U.S. PATENT DOCUMENTS

| | | | | |
|---|---|---|---|---|
| 6,147,389 | A * | 11/2000 | Stern et al. | 257/434 |
| 6,534,711 | B1 * | 3/2003 | Pollack | 174/529 |
| 6,765,801 | B1 * | 7/2004 | Glenn et al. | 361/764 |
| 7,077,969 | B2 * | 7/2006 | Jerominek et al. | 216/17 |
| 2003/0017648 | A1 * | 1/2003 | Pierson | 438/110 |
| 2011/0095413 | A1 | 4/2011 | Barth et al. | |
| 2011/0121464 | A1 | 5/2011 | Pendse | |

* cited by examiner

*Primary Examiner* — Lee D Wilson
*Assistant Examiner* — Shantese McDonald
(74) *Attorney, Agent, or Firm* — Slater & Matsil, L.L.P.

(57) ABSTRACT

Packaging process tools and packaging methods for semiconductor devices are disclosed. In one embodiment, a packaging process tool for semiconductor devices includes a mechanical structure including a frame. The frame includes a plurality of apertures adapted to retain a plurality of integrated circuit dies therein. The frame includes at least one hollow region.

20 Claims, 4 Drawing Sheets

PACKAGING PROCESS TOOLS AND PACKAGING METHODS FOR SEMICONDUCTOR DEVICES

This application is a divisional of U.S. application Ser. No. 13/270,890, filed Oct. 11, 2011, and entitled "Packaging Process Tools and Packaging Methods for Semiconductor Devices," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One smaller type of packaging for semiconductors is a flip chip (FC) ball grid array (BGA) package, in which semiconductor die are placed upside-down on a substrate and bonded to the substrate using micro-bumps. The substrate has wiring routed to connect the micro-bumps on the die to contact pads on the substrate that have a larger footprint. An array of solder balls is formed on the opposite side of the substrate and is used to electrically connect the packaged die to an end application.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related generally to semiconductor devices, and more particularly to the packaging of integrated circuits. Novel packaged semiconductor devices are disclosed, wherein a packaging process tool comprises a hollow jig that reduces or eliminates warpage during packaging processes such as thermal cycling and solder reflow processes.

Figure 1:
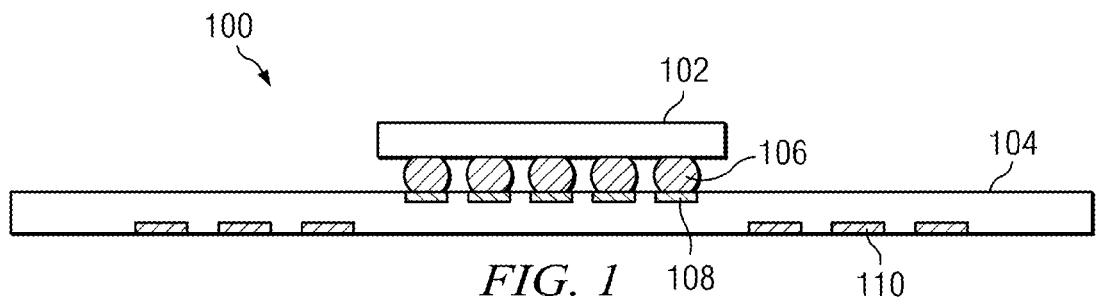
FIG. 1 shows a cross-sectional view of an integrated circuit die attached to a packaging substrate according with an embodiment of the present disclosure.

FIG. 1 shows a cross-sectional view of a semiconductor device 100 wherein an integrated circuit die 102 is attached to a packaging substrate 104 in accordance with an embodiment of the present disclosure. To package the integrated circuit die 102, first, a packaging substrate 104 is provided. The packaging substrate 104 may comprise a ceramic, plastic, and/or organic material, as examples, although alternatively, the packaging substrate 104 may comprise other materials. The packaging substrate 104 may comprise a substrate for a flip-chip ball grid array (FC-BGA) package, flip-chip chip scale package (FC-CSP), land grid array (LGA) package, or bond-on-trace (BOT) package, as examples, although alternatively, other types of packaging substrates 104 may be used.

A plurality of integrated circuit dies 102 is also provided. Only one integrated circuit die 102 is shown in FIG. 1; however, a plurality of dies 102 is attached to the surface of the packaging substrate 104, elsewhere on the packaging substrate 104. The integrated circuit dies 102 may comprise a plurality of circuits and electrical components formed thereon, not shown. The integrated circuit dies 102 may have been previously fabricated on a semiconductor wafer or workpiece (not shown in FIG. 1; see FIG. 2 at 101) comprising a semiconductor material such as silicon or other semiconductors and singulated on scribe lines to form a plurality of single dies 102, for example. The integrated circuit dies 102 may comprise a shape of a square or rectangle in a top view (not shown in FIG. 1; see the perspective views of FIGS. 3 and 4). The integrated circuit dies 102 are also referred to herein as dies or semiconductor devices, for example. A plurality of bumps 106 is disposed on a surface of the integrated circuit die 102, wherein the bumps 106 comprise contacts for the integrated circuit die 102.

A plurality of bond pads 108 is disposed on the top surface of the packaging substrate 104. The bond pads 108 are adapted to be coupled to the bumps 106 of the integrated circuit die 102 and comprise a similar pattern as the bumps 106. A plurality of contact pads 110 is disposed on the bottom surface of the packaging substrate 104. The contact pads 110 are adapted to be coupled a plurality of solder balls 148 (not shown in FIG. 1; see FIG. 10) in some embodiments. Conductive wiring (not shown) may be disposed within insulating material layers (also not shown) of the packaging substrate 104. The conductive wiring is disposed between and electrically connects the plurality of contact pads 110 and the plurality of bond pads 108 of the packaging substrate 104. The conductive wiring, contact pads 110, and bond pads 108 may comprise electrical connections that are formed by lithography within the packaging substrate 104, for example. The electrical connections may comprise copper, aluminum, other metals, or multiple layers or combinations thereof, as examples. Some of the electrical connections may comprise a redistribution layer (RDL) (not shown) formed in the packaging substrate 104, e.g., proximate a surface of the substrate 104 in some embodiments. The RDL may include fan-out regions of wiring. The integrated circuit die 102 may be electrically coupled to the RDL of the substrate 104, for example.

Figure 2:
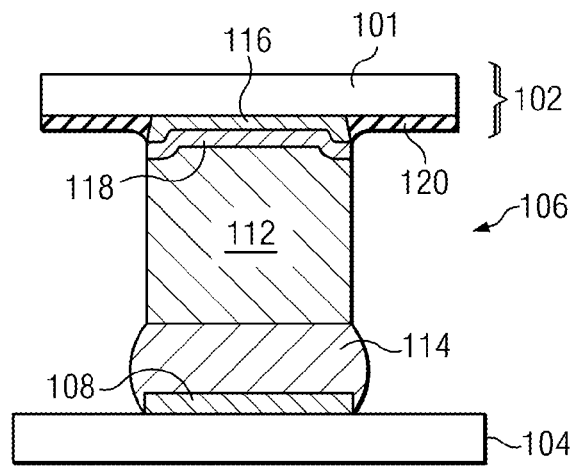
FIG. 2 shows a more detailed view of a bump of the integrated circuit die that will be soldered to a packaging substrate.

FIG. 2 shows a more detailed cross-sectional view of a portion of FIG. 1 including a bump 106 on the integrated circuit die 102. FIG. 2 illustrates a BOT joint in some embodiments, for example. The die 102 includes a workpiece 101 comprising silicon or other semiconductive material. The die 102 includes an insulating material 120 and conductive wiring 116 formed proximate the surface of the workpiece 101. The wiring 116 may be electrically coupled between the bumps 106 and electrical components (not shown) of the integrated circuit die 102, for example. The wiring 116 may comprise aluminum pads in some embodiments, for example, although other metals may be used. An under ball metallization (UBM) 118 structure may optionally be formed over the conductive wiring 116 of the die 102 to facilitate the attachment of the bumps 106.

In some embodiments, the bumps 106 comprise microbumps, for example. Each bump 106 may include an optional metal stud 112 that may comprise copper, a copper alloy, or other metals, and solder 114 formed over the metal stud 112. The bumps 106 may alternatively comprise other materials. The metal studs 112 may be formed of any suitable conductive material, including Cu, Ni, Pt, Al, combinations thereof, and may be formed through any number of suitable techniques, including PVD, CVD, electrochemical deposition (ECD), molecular beam epitaxy (MBE), atomic layer deposition (ALD), electroplating, and the like. An optional conductive cap layer may be formed between the metal stud 112 and the solder 114, not shown. For example, in an embodiment in which the metal stud 112 is formed of copper, a conductive cap layer formed of nickel may be desirable. Other materials, such as Pt, Au, Ag, combinations thereof, or the like, may also be used.

The solder 114 is formed over an end of the metal stud 112 and/or on the optional conductive cap layer. The solder 114 may also be directly formed on the wiring 116 or UBM 118 of the die 102, for example, in embodiments where a metal stud 112 and cap layer is not included. The solder 114 material may comprise SnPb, a high-Pb material, a Sn-based solder, a lead-free solder, or other suitable conductive materials, as examples. The bumps 106 may comprise a height (in a vertical direction in the drawings) of about 50 µm or less and a width of about 35 µm, for example, although the bumps may also comprise other dimensions.

Figure 3:
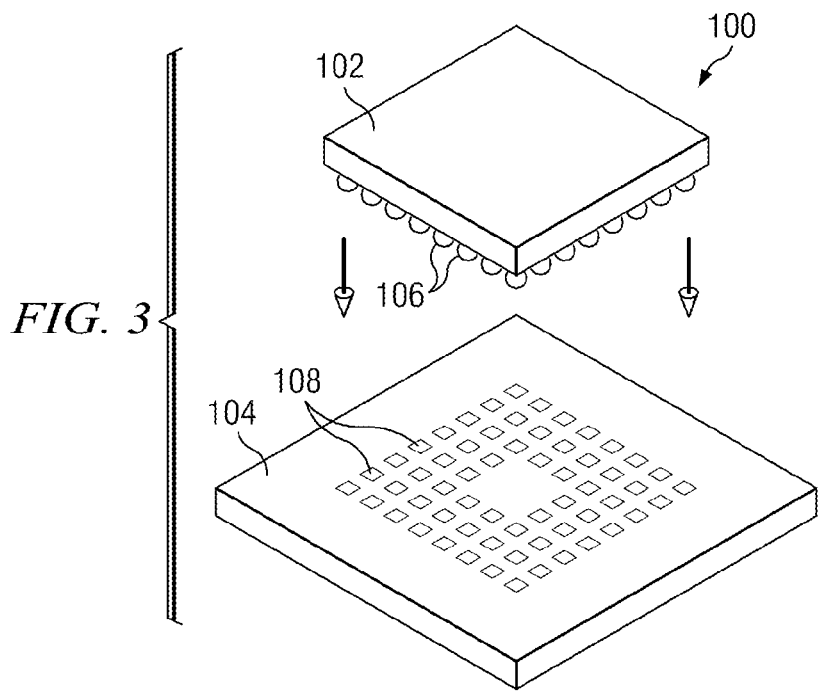
FIG. 3 shows a perspective view of an integrated circuit die being coupled to a packaging substrate according with embodiments.

FIG. 3 shows a perspective view of an integrated circuit die 102 being attached to a packaging substrate 104 to illustrate a possible arrangement of bumps 106 on a die 102. The integrated circuit die 102 includes a plurality of bumps 106 formed on a surface thereof. The bumps 106 are formed in a peripheral region of the die 102 and may be arranged in one or more rows in the peripheral region. As an example, the bumps 106 are arranged in three rows on each side of the integrated circuit die 102 in FIG. 3 (as can be seen by the pattern of the bond pads 108 on the packaging substrate 104), along a die edge or corners. The bumps 106 may alternatively be arranged in other patterns and may be positioned in other locations. Other embodiments may utilize aspects with bump structures along interior portions of the die, for example. The placement of the bump structures are provided for illustrative purposes only and the specific locations and patterns of the bump structures may vary and may include, as examples, an array of bumps, lines of bumps in a middle region of the die 102, or staggered bumps. The illustrated die 102 and bump 106 sizes and placement are provided for reference only and are not intended to be actual sizes or actual relative sizes.

Figure 4:
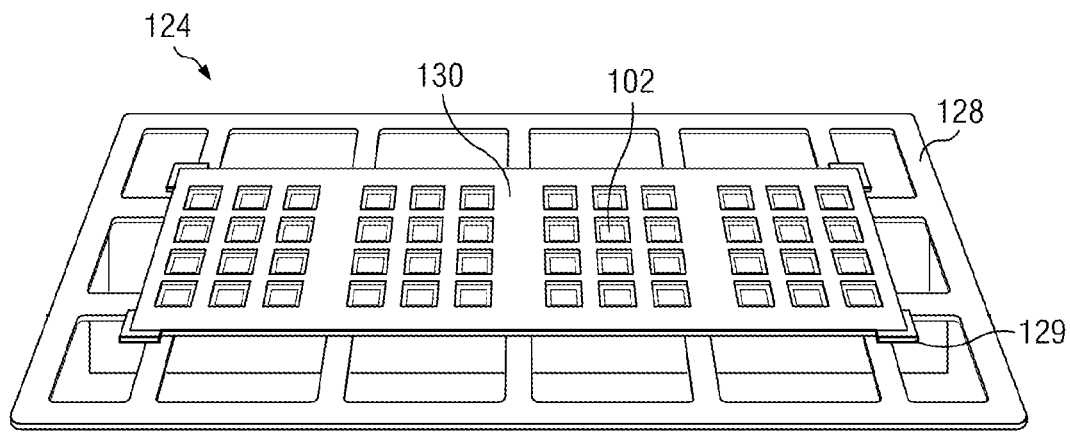
FIG. 4 is a perspective view of a packaging process tool for maintaining correct positional relationship of integrated circuit dies with respect to a packaging substrate in accordance with embodiments of the present disclosure implemented in a packaging process system.

FIG. 4 shows a perspective view of a packaging process system 124 in accordance with an embodiment of the present disclosure. A packaging process tool 130 for maintaining correct positional relationship of integrated circuit dies 102 with respect to a packaging substrate 104 is implemented in the packaging process system 124. The packaging process tool 130 comprises a mechanical structure that includes a frame having a plurality of apertures adapted to retain a plurality of integrated circuit dies 102 therein, as shown. The frame comprises one or more hollow regions, to be described further herein. The packaging process tool 130 is also referred to herein as a jig, a hollow jig, or a mechanical structure.

The packaging process system 124 includes a support 128 for a packaging substrate 104 and a support 129 for the packaging process tool 130. The support 128 may comprise a supporting boat or other types of supports, for example. The support 129 for the packaging process tool 130 may be disposed proximate the support 128 for the packaging substrate 104 and may be coupled to the support 128 for the packaging substrate 104 in some embodiments. The support 129 for the packaging process tool 130 may comprise one or more brackets coupled to the support 128 for the packaging substrate 103 and may be coupleable to the corners and/or sides of the packaging process tool 130, e.g., by levers or latches. The supports 128 and 129 may alternatively comprise other configurations.

The packaging process system 124 is adapted to be used to perform packaging processes on a packaging substrate 104 and integrated circuit dies 102. In some embodiments, the packaging processes may comprise thermal processes wherein the packaging substrate 104 and integrated circuit dies 102 are heated to an elevated temperature, for example. In some embodiments, the packaging processes comprise solder reflow processes.

Figure 6:
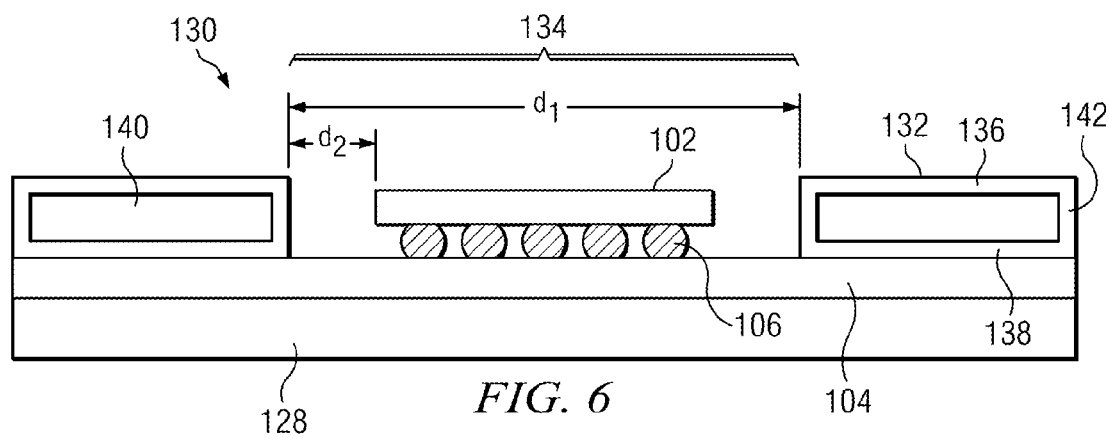
FIG. 6 is a cross-sectional view of a portion of the packaging process tool and an integrated circuit die positioned on a packaging substrate on a support for processing.

The integrated circuit dies 102 shown in FIG. 4 are coupled beneath the packaging process tool 130 to a packaging substrate 104 (not visible in FIG. 4; see FIG. 6). The packaging process tool 130 is placed as a cover over the packaging substrate 104 between the integrated circuit dies 102 during appropriate times during the packaging process. The packaging substrate 104 and packaging process tool 130 may be substantially rectangular in a top view, as shown, or may comprise other shapes. The plurality of dies 102 are arranged in an array-like structure of columns and rows on the packaging substrate 104. The dies 102 on the packaging substrate 104 are arranged in groups, as shown, to provide unused areas on the packaging substrate 104 where the packaging process tool 130 during a solder flow process or other packaging process may be placed upon to facilitate in positioning of the dies 102, for example.

Figure 5:
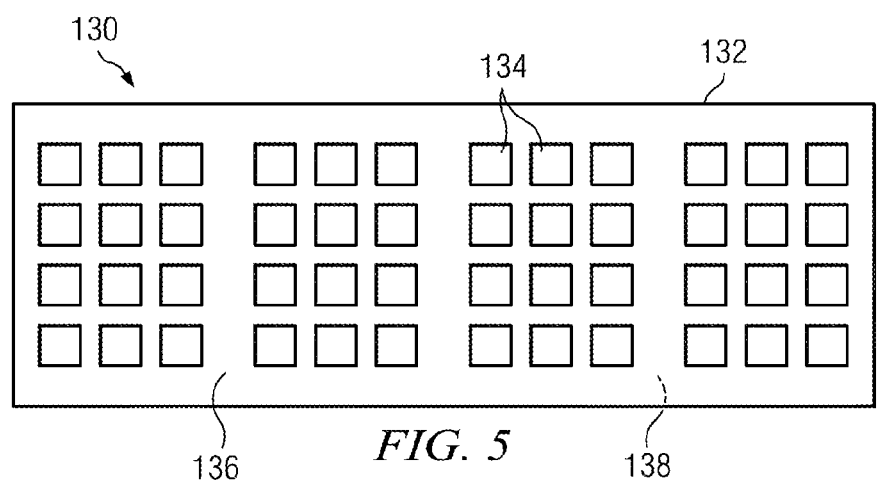
FIG. 5 shows a top view of the packaging process tool.

FIG. 5 shows a top view of the packaging process tool 130. The packaging process tool 130 comprises a hollow jig having a frame 132 that includes a plurality of apertures 134 formed therein. The apertures 134 are square or rectangular in shape and are slightly larger than the dies 102 that the packaging process tool 130 will be used to process. The frame 132 has a first side 136 comprising a top side in the views in FIGS. 5 and 6, and a second side 138 opposite the first side 136, which comprises a bottom side, as shown in FIG. 6.

FIG. 6 is a cross-sectional view of a portion of the packaging process tool 130 and an integrated circuit die 102 positioned on a packaging substrate 104 disposed on a support 128 such as support 128 shown in FIG. 4. The frame 132 of the hollow jig 130 includes at least one hollow region 140 formed therein. The aperture 134 for the dies 102 comprises a width comprising dimension $d_1$ which is slightly wider than a width of the die 102. The aperture 134 may be larger on both sides of the die 102 by a predetermined dimension $d_2$. Dimension $d_1$ may comprise about 0.5 mm to about 50 mm, and dimension $d_2$ may comprise about 0.01 mm to about 5 mm, for example, although alternatively, dimensions $d_1$ and $d_2$ may comprise other values.

The first side 136 of the frame 132 is coupled to the second side 138 of the frame 132 by connecting members 142, as shown. Edges of the frame 132 (e.g., at edges of the first side 136 and second side 138, in and out of the paper in the view shown) are enclosed so that the hollow region 140 is fully enclosed on all sides by connecting members 142. The connecting members 142 are coupled between the first side 136 and the second side 138 at edges of the first side 136 and the second side 138, for example.

Figure 7:
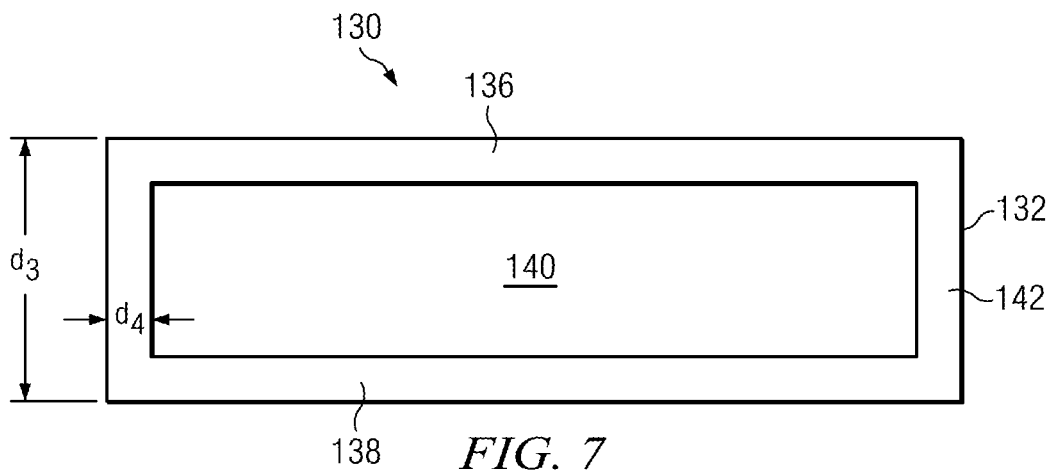
FIG. 7 shows a more detailed view of a cross-section of a portion of the packaging process tool, wherein the packaging process tool comprises a hollow jig.

FIG. 7 shows a more detailed view of a cross-section of a portion of the packaging process tool 130. The frame 132 of the hollow jig 130 comprises a single hollow region 140 disposed between, e.g., enclosed by, the first side 136, the second side 138, and connecting members 142 in this embodiment. The thickness of the frame 130 comprises a dimension $d_3$ in a vertical direction in FIG. 7, and the thickness of the first side 136, the second side 138, and connecting members 142 comprises a dimension $d_4$. Dimension $d_3$ may comprise about 1 mm to about 100 mm, and dimension $d_4$ may comprise about 0.1 mm to about 10 mm, for example, although alternatively, dimensions $d_3$ and $d_4$ may comprise other values.

Figure 8:
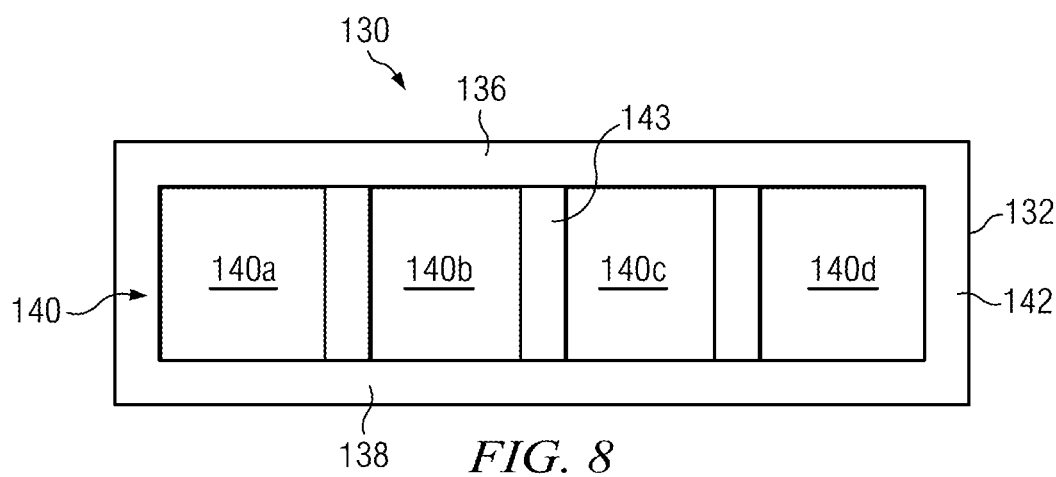
FIG. 8 shows an embodiment wherein the hollow jig includes support members extending between a first side and second side of a frame of the hollow jig.
Figure 9:
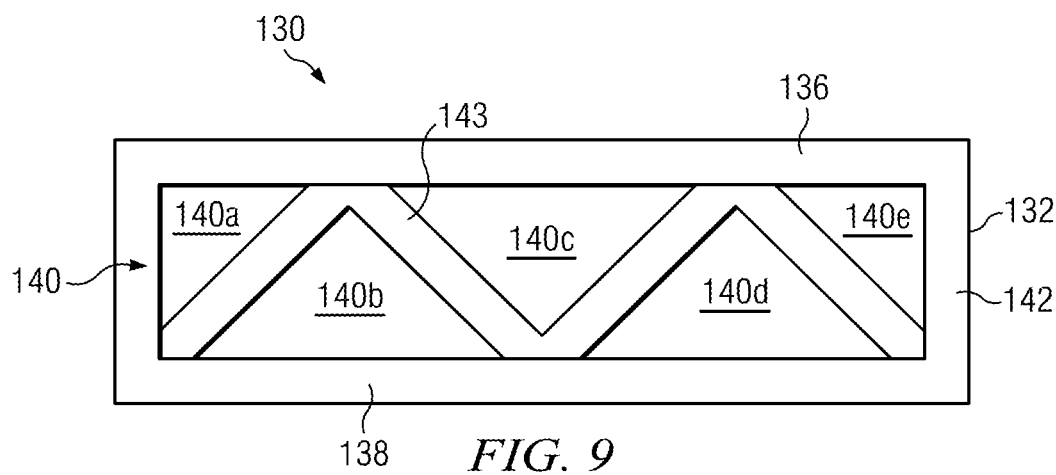
FIG. 9 shows another embodiment wherein support members within the hollow jig are positioned in a triangular manner between the first side and the second side of the frame of the hollow jig.

Support members 143 may optionally be included within the hollow region 140 of the frame 132 in some embodiments, as shown in FIGS. 8 and 9. At least one support member 143 may be included within the hollow region 140 of the frame 132. For example, FIG. 8 shows an embodiment wherein the hollow jig 130 includes support members 143 extending between the first side 136 and the second side 138 of the frame 132. The support members 143 of the frame 132 are disposed substantially perpendicular to the first side 136 and the second side 138 in this embodiment in a vertical direction. Alternatively, the support members 143 may be disposed substantially perpendicular to opposing connecting members 142 in a horizontal direction, for example, not shown.

FIG. 9 shows another embodiment wherein support members 143 within the hollow jig 130 are positioned in a triangular manner between the first side 136 and the second side 138 of the frame 132 of the hollow jig 130. The support members 143 of the frame 132 are disposed non-perpendicular relative to the first side 136 or the second side 138 in this embodiment, for example. Likewise, the support members 143 of the frame 132 may be disposed non-perpendicular relative to opposing connecting members 142, not shown. The support members 143 may be arranged within the hollow region 140 in other configurations and shapes, for example, not shown. The optional support members 143, if included, are narrow in some embodiment to reduce heat transfer characteristics of the hollow jig 130.

In embodiments wherein support members 143 are included inside the frame 132, the hollow region 140 includes a plurality of hollow regions 140a, 140b, 140c, 140d, and 140e within the hollow jig 130, also shown in FIGS. 8 and 9. The plurality of hollow regions 140a, 140b, 140c, 140d, and 140e is disposed between the inner walls of the first side 136, the second side 138, and connecting members 142, and between the walls of the support members 143, as shown.

The hollow jig 130 may comprise stainless steel, aluminum, ceramic, rubber, epoxy, a plastic polymer, or combinations thereof, as examples. The hollow jig 130 may be formed by a molding process; a damascene process; machining; welding, riveting, or screwing together multiple parts; injection molding; other methods; or combinations thereof, as examples. Alternatively, the hollow jig 130 may comprise other materials and may be formed by other methods.

The hollow jig 130 is advantageous in that mechanical stress is reduced during processes that the packaging substrate 104 and integrated circuit dies 102 are exposed to that the hollow jig 130 is implemented in, such as thermal processes that may require a high temperature. The hollow jig 130 transfers less heat during thermal processes, which reduces or eliminating warpage in packaged integrated circuit die 150 (see FIG. 10), e.g., warping of the packaging substrate 104 and/or the integrated circuit dies 102. Thus, the hollow jig 130 provides warpage behavior control during a solder reflow process and other thermal processes or packaging processes.

The solder reflow process using the hollow jig 130 described herein reflows the solder 114 of the bumps 106 and electrically couples the die 102 to the package substrate 104. Before the solder reflow process, the die 102 may be attached to the packaging substrate 104 using an adhesive, or the solder 114 may also function as a mechanical attachment to the package substrate 104. The bumps 106 of the integrated circuit die 102 may be coupled to bond pads 108 of the packaging substrate 104 using a solder process, solder reflow process, and/or thermal compression bonding, as examples. Alternatively, other methods may be used to electrically connect the integrated circuit die 102 to the packaging substrate 104.

Figure 10:
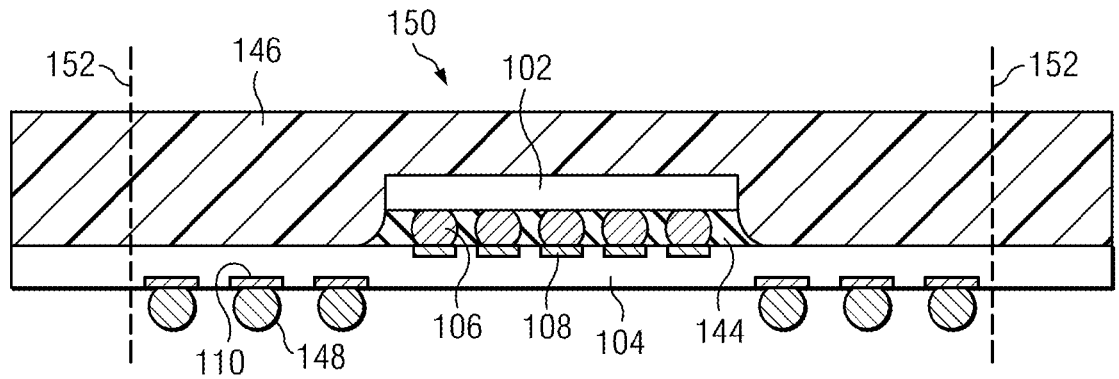
FIG. 10 shows a cross-sectional view of a packaged integrated circuit die after the completion of a packaging process utilizing the hollow jig of embodiments described herein.

After the hollow jig 130 is used during a solder reflow process or other packaging process, the packaging of the integrated circuit die 102 is continued. An under-fill material 144 is formed under the integrated circuit die 102, as shown in FIG. 10 in a cross-sectional view. The under-fill material 144 may comprise a filler, an epoxy, a hardener, or multiple layers or combinations thereof, as examples, although alternatively, the under-fill material 144 may comprise other materials. The under-fill material 144 may comprise a material with a viscosity sufficient to flow at least partially, and in some embodiments, to flow completely beneath the integrated circuit die 102, for example. A molding compound 146 is formed over the integrated circuit die 102, the under-fill material 144, and the packaging substrate 104, also shown in FIG. 10. The molding compound 146 may comprise an epoxy, a filler, an organic material, or multiple layers or combinations thereof, for example, although the molding compound 146 may also comprise other materials. The molding compound 146 may extend above a top surface of the integrated circuit die 102 by about 10 μm or greater, for example. If the integrated circuit die 102 is large, a greater amount of molding compound 146 may be used, to provide more robustness for the package, in some embodiments. Solder balls 148 may be formed on contact pads 110 of the substrate 104, as shown. The packaged dies 150 are then singulated at the scribe lines or singulation lines 152, shown in phantom in FIG. 10, and the packaged dies 150 are separated from one another. The packaged semiconductor device 150 may optionally be attached using the solder balls 148 (or the contact pads 110, if the solder balls 148 are not included) to another device, printed circuit board (PCB), or other end applications.

Figure 11:
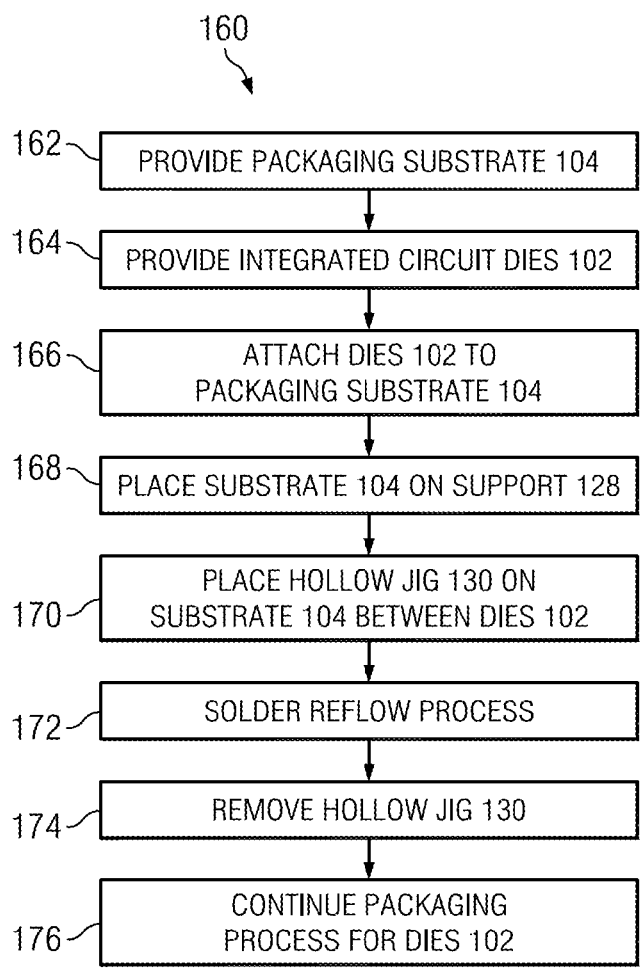
FIG. 11 is a flow chart illustrating a method of using a packaging process tool comprising the hollow jig described herein.

FIG. 11 is a flow chart 160 illustrating a method of packaging a semiconductor device 102 in accordance with an embodiment of the present disclosure utilizing the hollow jig 130 described herein. The method includes providing a packaging substrate 104 (step 162). A plurality of integrated circuit dies 102 are provided (step 164), and the dies 102 are attached to the packaging substrate 104 (step 166). The packaging substrate 104 is placed on a support 128 of a packaging process system 124 (step 168; see FIG. 4), and a hollow jig 130 in accordance with embodiments described herein is placed on the packaging substrate 104 proximate (e.g., between) the plurality of dies 102 (step 170). A solder reflow process (step 172) or other process is then used to electrically couple the dies 102 to the packaging substrate 104. The hollow jig 130 is then removed (step 174), and the packaging process for the integrated circuit dies 102 is then continued (step 176). Alternatively, the hollow jig 130 may used for other processes in a packaging process flow for integrated circuits, for example.

Advantages of embodiments of the disclosure include providing novel packaging techniques that have increased reliability and higher yields due to the use of the packaging process tool 130 comprising a hollow jig in accordance with embodiments described herein. The jig 130 maintains mechanically the correct positional relationship of the integrated circuit dies 102 and the packaging substrate 104 during the packaging processing while also preventing or reducing heat transfer. Warping and bending effects of the packaging substrate 104 and/or the dies 102 during thermal stress such as solder reflow processes are reduced or eliminated by embodiments of the disclosure described herein, due to the reduction in thermal expansion in the packaging substrate 104 during the solder joint formation. The hollow jigs 130 reduce the amount of heat transferred, reducing CTE mismatch and thermal expansion. Joint reliability is improved, by reducing or preventing shorts from bridging or opens from cracks in the solder joints between the bumps 106 and bond pads 108. Cracks or cold joints in connections of the bumps 106 and delaminations of the various material layers of the package (which may comprise low k material layers) are reduced or minimized, improving reliability. The novel packaging methods for semiconductor devices 102 are easily implemented in manufacturing and packaging process flows.

In one embodiment, a packaging process tool for semiconductor devices includes a mechanical structure comprising a frame. The frame includes a plurality of apertures adapted to retain a plurality of integrated circuit dies therein. The frame comprises at least one hollow region.

In another embodiment, a method of packaging a semiconductor device includes providing a packaging substrate, providing a plurality of integrated circuit dies, and attaching the plurality of integrated circuit dies to the packaging substrate. The method includes placing the packaging substrate on a support, and placing a mechanical structure comprising a frame on the packaging substrate proximate the plurality of integrated circuit dies, the frame including a plurality of apertures adapted to retain each of the plurality of integrated circuit dies therein, the frame comprising at least one hollow region. A packaging process is performed on the plurality of integrated circuit dies and the packaging substrate.

In yet another embodiment, a method of packaging a semiconductor device includes providing a packaging substrate, and providing a plurality of integrated circuit dies, each of the plurality of integrated circuit dies including a plurality of bumps disposed thereon, the plurality of bumps including solder. The plurality of integrated circuit dies is attached to the packaging substrate, and the packaging substrate is placed on a support. A mechanical structure comprising a frame is placed on the packaging substrate proximate the plurality of integrated circuit dies, the frame including a plurality of apertures adapted to retain each of the plurality of integrated circuit dies therein, the frame comprising at least one hollow region. The solder of the plurality of bumps of the dies is then reflowed using a solder reflow process.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A packaging tool for semiconductor devices comprising:
a mechanical structure comprising a frame including a plurality of apertures adapted to retain a plurality of integrated circuit dies therein, wherein the plurality of apertures are uncovered, wherein the frame comprises at least one enclosed hollow region, wherein the plurality of apertures are spaced apart from the enclosed hollow region.

2. The packaging tool according to claim 1, further comprising:
a first support for a packaging substrate; and
a second support for the mechanical structure proximate the first support for the packaging substrate.

3. The packaging tool according to claim 1, wherein the frame of the mechanical structure includes a first side, a second side opposite the first side, and a plurality of connecting members coupled between the first side and the second side at edges of the first side and the second side.

4. The packaging tool according to claim 3, wherein the first side, the second side, and the plurality of connecting members of the frame comprise a thickness of about 0.1 mm to about 10 mm.

5. The packaging tool according to claim 3, wherein the first side, the second side, and the plurality of connecting members of the frame comprise stainless steel, aluminum, ceramic, rubber, epoxy, a plastic polymer, or combinations thereof.

6. The packaging tool according to claim 3, wherein the frame further comprises at least one support member coupled between the first side and the second side or between opposing connecting members.

7. The packaging tool according to claim 6, wherein the at least one support member of the frame is disposed substantially perpendicular to the first side and the second side or to the opposing connecting members.

8. The packaging tool according to claim 6, wherein the at least one support member of the frame is disposed non-perpendicular relative to the first side or the second side or to the opposing connecting members.

9. A packaging tool for semiconductor devices comprising:
    a jig having one or more enclosed regions, the jig having a plurality of apertures adapted to retain integrated circuit dies, the jig comprising:
        a first member having a first plurality of openings;
        a second member having a second plurality of openings, the first plurality of openings being aligned with the second plurality of openings; and
        sidewalls connecting the first member and the second member such that the first member is spaced apart from the second member;
    a packaging substrate support adapted to support a packaging substrate during processing; and
    a jig support adapted to support the jig in position relative to the packaging substrate.

10. The packaging tool according to claim 9, wherein the jig further comprises one or more support members extending between the first member and the second member, the one or more support members being interposed between the sidewalls.

11. The packaging tool according to claim 10, wherein the support members are perpendicular to the first member and the second member.

12. The packaging tool according to claim 10, wherein the support members are non-perpendicular to the first member and the second member.

13. The packaging tool according to claim 9, wherein the first member and the second member each have a thickness of about 0.1 mm to about 10 mm.

14. The packaging tool according to claim 9, wherein the jig comprises stainless steel, aluminum, ceramic, rubber, epoxy, a plastic polymer, or combinations thereof.

15. The packaging tool of claim 9, wherein the first member and the second member are parallel.

16. A packaging tool for semiconductor devices comprising:
    a jig, the jig comprising:
        a first member having a first plurality of openings;
        a second member parallel to the first member, the second member having a second plurality of openings; and
        sidewall members interposed between the first member along the first plurality of openings and the second member along the second plurality of openings, thereby forming apertures extending from the first member to the second member, and thereby forming a void between the first member and the second member.

17. The packaging tool according to claim 16, further comprising:
    a first support for a packaging substrate; and
    a second support for the jig proximate the first support for the packaging substrate.

18. The packaging tool according to claim 16, wherein at least one of the first member and the second member have a thickness of about 0.1 mm to about 10 mm.

19. The packaging tool according to claim 16, wherein the jig comprises stainless steel, aluminum, ceramic, rubber, epoxy, a plastic polymer, or combinations thereof.

20. The packaging tool according to claim 16, wherein the jig has a thickness of about 1 mm to about 100 mm.

* * * * *